(12) United States Patent
Tsai et al.

(10) Patent No.: US 9,812,488 B2
(45) Date of Patent: Nov. 7, 2017

(54) BACKSIDE ILLUMINATED IMAGE SENSOR AND METHOD OF MANUFACTURING THE SAME

(71) Applicant: TAIWAN SEMICONDUCTOR MANUFACTURING COMPANY LTD., Hsinchu (TW)

(72) Inventors: Tsung-Han Tsai, Miaoli County (TW); Yun-Wei Cheng, Taipei (TW); Chun-Hao Chou, Tainan (TW); Kuo-Cheng Lee, Tainan (TW); Yung-Lung Hsu, Tainan (TW); Hsin-Chi Chen, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/854,672

(22) Filed: Sep. 15, 2015

(65) Prior Publication Data
US 2016/0343752 A1    Nov. 24, 2016

Related U.S. Application Data

(60) Provisional application No. 62/163,548, filed on May 19, 2015.

(51) Int. Cl.
*H01L 27/146*        (2006.01)

(52) U.S. Cl.
CPC ...... *H01L 27/1464* (2013.01); *H01L 27/1463* (2013.01); *H01L 27/14614* (2013.01);
(Continued)

(58) Field of Classification Search
CPC ................... H01L 27/14607; H01L 27/14614
See application file for complete search history.

(56) References Cited

U.S. PATENT DOCUMENTS

| 9,029,973 | B2 | 5/2015 | Lim et al. |
| 2012/0001234 | A1* | 1/2012 | Lim ............ H01L 27/1461 257/222 |

(Continued)

FOREIGN PATENT DOCUMENTS

| KR | 10-1083638 | 11/2011 |
| KR | 10-2013-0081953 | 7/2013 |
| KR | 10-2015-0033606 | 4/2015 |

OTHER PUBLICATIONS

Office action and search report dated Mar. 4, 2017 from the Korean Intellectual Property Office for application 10-2015-0168866.

*Primary Examiner* — Daniel Whalen
(74) *Attorney, Agent, or Firm* — WPAT, P.C., Intellectual Property Attorneys; Anthony King

(57) ABSTRACT

A backside illuminated (BSI) image sensor comprises a semiconductor substrate having a first surface and a second surface opposite to the first surface; a photosensitive element in the semiconductor substrate; a gate structure partially over the first surface of the semiconductor substrate; and a temporary carrier depository in proximity to the first surface of the semiconductor substrate, wherein the gate structure has a plug portion extending from the first surface toward the second surface. The plug portion of the gate structure helps to increase the charge transfer efficiency so as to improve quantum efficiency of the BSI image sensor.

20 Claims, 19 Drawing Sheets

(52) U.S. Cl.
CPC .. *H01L 27/14638* (2013.01); *H01L 27/14689* (2013.01); *H01L 27/14621* (2013.01); *H01L 27/14627* (2013.01); *H01L 27/14643* (2013.01)

(56) References Cited

U.S. PATENT DOCUMENTS

| | | | |
|---|---|---|---|
| 2013/0175582 A1* | 7/2013 | Ihara | H01L 27/1461 257/222 |
| 2013/0221410 A1* | 8/2013 | Ahn | H01L 31/0232 257/225 |
| 2015/0243694 A1* | 8/2015 | Ihara | H01L 27/14605 257/443 |
| 2015/0325606 A1 | 11/2015 | Togashi et al. | |

* cited by examiner

BACKSIDE ILLUMINATED IMAGE SENSOR AND METHOD OF MANUFACTURING THE SAME

PRIORITY CLAIM AND CROSS-REFERENCE

This application claims the benefit of provisional application Ser. 62/163,548 filed on May 19, 2015, entitled "BACKSIDE ILLUMINATED IMAGE SENSOR AND METHOD OF MANUFACTURING THE SAME," the disclosure of which is hereby incorporated by reference in its entirety.

FIELD

The present disclosure relates to image sensors, and more particularly, to backside illuminated image sensors and manufacturing methods of forming thereof.

BACKGROUND

Semiconductor image sensors are used for converting optical images into electrical signals and they may be categorized into complementary metal-oxide-semiconductor (CMOS) image sensors and charge-coupled device (CCD) sensors, which are widely used in various applications such as digital still camera or mobile phone camera applications.

Generally, CMOS image sensors are gaining in popularity over traditional charged-coupled devices due to certain advantages inherent in the CMOS image sensors. Particularly, CMOS image sensors typically require lower voltages, consume less power, enable random access to image data, may be fabricated with compatible CMOS processes, and enable integrated single-chip cameras. In general, CMOS image sensors utilize light-sensitive CMOS circuitry, which may include a photosensitive element in a silicon substrate, to convert light energy into electrical energy. As the photosensitive element is exposed to light, an electrical charge is induced in the photosensitive element. The charge generated by the photosensitive element is then controlled and sampled by a MOS switching transistor.

CMOS image sensors can be further divided into two major categories, namely front-side illuminated (FSI) image sensors and back-side illuminated (BSI) image sensors depending on the light path difference. In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photosensitive element so as to reduce quantum efficiency. In contrast, there is no obstruction from additional layers (e.g., metal layers) in a BSI image sensor. Light is incident on the backside of the CMOS image sensor. As a result, light can strike the photosensitive element through a direct path. Such a direct path helps to increase the number of photons converted into electrons.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
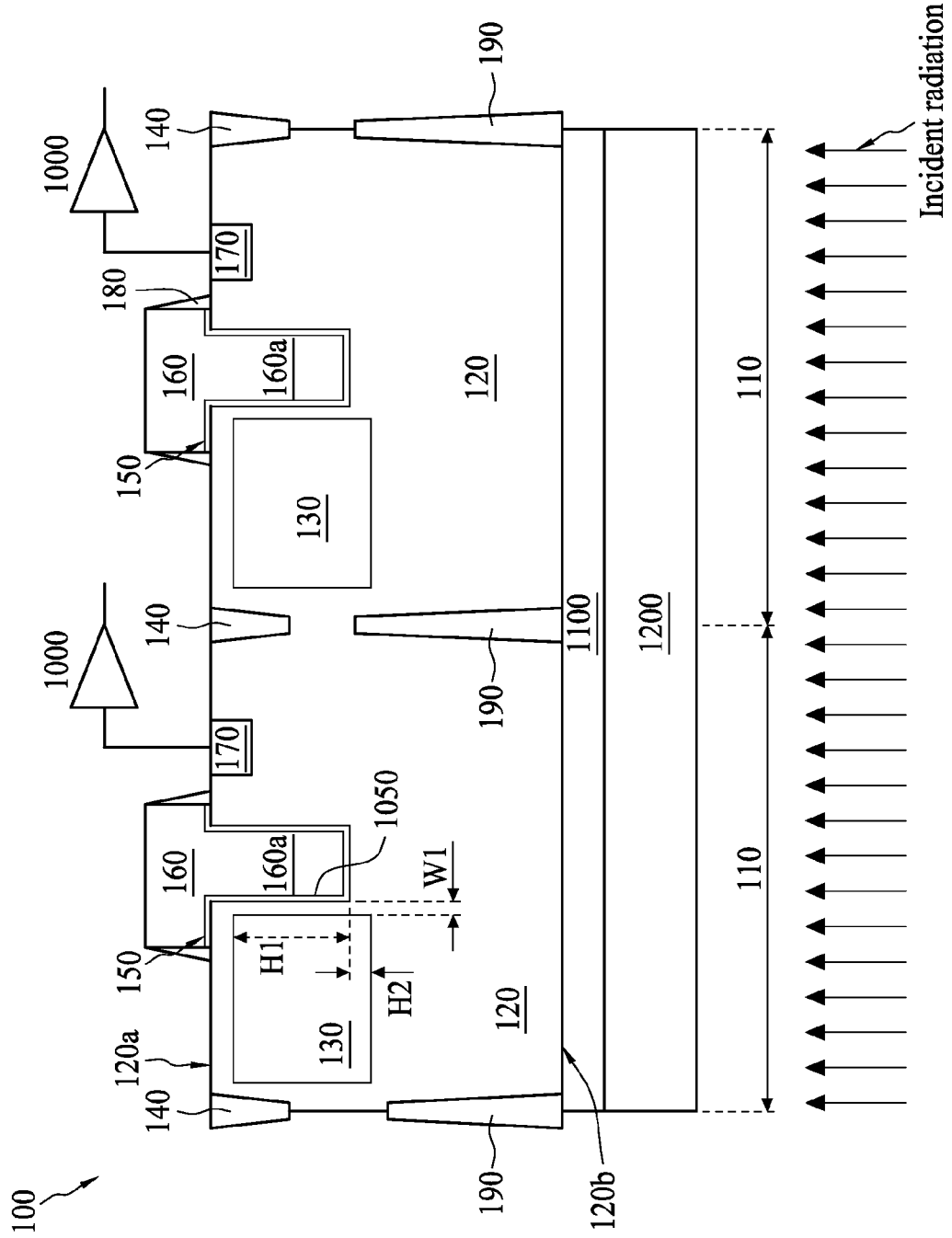
FIG. 1 is a cross-sectional view illustrating a backside illuminated (BSI) image sensor device 100 in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The manufacturing and use of the embodiments of the present disclosure are discussed in details below. It should be appreciated, however, that the embodiments provide many applicable inventive concepts that can be embodied in a wide variety of specific contexts. It is to be understood that the following disclosure provides many different embodiments or examples for implementing different features of various embodiments. Specific examples of components and arrangements are described below to simplify the present disclosure. These are, of course, merely examples and are not intended to be limiting.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Further, it is understood that several processing operations and/or features of a device may be only briefly described. Also, additional processing operations and/or features can be added, and certain of the following processing operations and/or features can be removed or changed while still implementing the claims. Thus, the following description should be understood to represent examples only, and are not intended to suggest that one or more operations or features is required.

A BSI image sensor device typically needs more than two kinds of pixels, classified by the incident radiation, forming a repeating unit for the pixel array. In the conventional BSI image sensor device, a thicker silicon substrate is used for both long and show wavelengths sensing. Typically, for example, infrared (IR) and red light belongs to long wavelengths application, and green and blue light belong to short wavelengths application. These are, of course, merely examples and are not intended to be limiting. Additionally, when the size of the pixel gets smaller, it may involve more crosstalk influences between neighboring pixels. Consequently, forming backside trench isolation (BTI) between neighboring pixels is needed to solve the aforementioned issues. Further, for the short wavelengths applications, the thicker silicon substrate will impede charges transfer from a photosensitive element to a temporary carrier depository, and thus, worsen charge transfer efficiency.

FIG. 1 illustrates a cross-sectional view of a BSI image sensor device 100 in accordance with some embodiments of the present disclosure. The BSI image sensor device 100 includes a pixel array having a plurality of pixels 110. Each of the pixels includes a semiconductor substrate 120 having a first surface 120a and a second surface 120b. In some embodiments, semiconductor substrate 120 may have a first conductive type, for example, a P-type substrate. Alternatively, the semiconductor substrate 120 may have a second conductivity type, for example, an N-type substrate. In addition, the semiconductor substrate 120 may include various doped regions each having an N-type or P-type, such as an N-well or P-well. In the depicted embodiment, the semiconductor substrate 120 is a silicon substrate. Alternatively, the semiconductor substrate 120 may include another elementary semiconductor, such as germanium and/or diamond; a compound semiconductor, an alloy semiconductor; or the combination thereof.

In the present embodiment, several photosensitive elements 130 are formed in the semiconductor substrate 120. The photosensitive elements 130 may be formed by implanting N-type dopant into a P-type substrate. In some embodiments, the positions or the dimensions of the photosensitive elements 130 are determined according to the wavelengths of the incident light.

Referring to FIG. 1, the BSI image sensor device 100 further include shallow trench isolations (STIs) 140 positioned between the neighboring pixels. Typically, an STI 140 is typically a trench extending into a predetermined depth of the semiconductor substrate 120 and filled with oxide or other dielectric materials. In the present embodiment, the dimensions of the STIs 140 may vary depending on the applications.

As depicted in FIG. 1, the gate structure 160 in each pixel 110 has a plug portion 160a extending into the semiconductor substrate 120. In some embodiments, the gate structure 160 is formed over a gate dielectric layer 150. In some other embodiments, the gate dielectric layer 150 extends beyond the gate structure 160 on top of the first surface 120a. For example, the gate structure 160 is made of conductive materials. In the present embodiment, the gate structure 160 is made of polysilicon and the dimension of the plug portions 160a may vary as a design factor according to different applications. In some embodiments, a surface 1050 of the plug portion 160a is laterally coupled to the photosensitive element 130. The surface 1050 includes a height H1 measured vertically from a bottom surface of the plug portion 160a to a top surface of the photosensitive element 130. The photosensitive element 130 includes a height H2 measured vertically from a bottom surface of the plug portion 160a to a bottom surface of the photosensitive element 130. In some embodiments, a ratio between the height H1 and the height H2 is proximately greater than 1. The width of the plug portion 160a can be chosen based on different applications or the size of the pixels. For example, the width of the plug portion 160a may be chosen down to between about 100 nm and about 250 nm. However, said values are not intended to be limiting. In the present disclosure, the term "laterally couple" is used to describe the spatial relationship between the photosensitive element and the plug portion. For example, the overlap between the photosensitive element and the plug portion, that is, the surface 1050 of the plug portion beside the photosensitive element in FIG. 1. However, the term "laterally couple" at least includes the following arrangements: (a) the photosensitive element and the plug portion are directly contacted, or (b) the photosensitive element and the plug portion are not directly contacted and a separation between the two is lower than a predetermined value W1, for example, from about 5 to about 200 nm, from about 5 to about 10 nm, or from about zero to about 5 nm. Spacers 180 are formed along the sidewalls of the gate structure 160. In some embodiments, the spacers 180 can be made of silicon oxide, silicon nitride or the combinations thereof. Temporary carrier depositories 170 are formed in proximity to the first surface 120a of the semiconductor substrate 120. The temporary carrier depositories 170 may temporarily store the charges generated in the photosensitive elements 130. The temporary carrier depositories 170 may connect to metal contacts and other circuitry and then transfer the charges to a processing unit 1000 for outputting electrical signals. The temporary carrier depositories 170 include a conductive type identical with a conductive type of the photosensitive element 130. The temporary carrier depositories 170 include the conductive type opposite to the conductive type of the semiconductor substrate 120.

In some embodiments, the BSI image sensor device 100 as shown in FIG. 1 may further include backside trench isolations (BTIs) 190 positioned between the neighboring pixels. Typically, a BTI 190 is a trench extending into a predetermined depth of the semiconductor substrate 120 from the second surface 120b and filled with oxide or other dielectric materials. In the present disclosure, the dimensions of the BTIs 190 may vary depending on the applications.

A bottom-anti-reflective coating (BARC) 1100 is disposed at the second surface 120b of the semiconductor substrate 120. In the depicted embodiment, the BARC 1100 directly contacts the second surface 120b of the semiconductor substrate 120. Alternatively, one or more layers may be disposed between the BARC 1100 and the second surface 120b of the semiconductor substrate 120. In some embodiments, the BARC 1100 can be a dielectric layer, such as a silicon carbide (SiC) layer. The BARC 1100 has a suitable thickness, so that the BSI image sensor device 100 exhibits optimal quantum efficiency and provides optimal transmittance of various light wavelengths to the semiconductor substrate 120.

Still referring to FIG. 1, a color filter layer 1200 overlies the second surface 120b of the semiconductor substrate 120. More specifically, the color filter layer 1200 overlies the BARC 1100 of the BSI image sensor device 100. In some embodiments, the color filter layer 1200 may include more than one type of color filter. For example, the color filter layer 1200 may include a set of color filters filtering long wavelengths, such as green light and blue light and another set of color filters filtering short wavelengths, such as red light or IR. The color filter layer 1200 may include suitable material, for example, a dye-based (or pigment-based) polymer for filtering out a specific frequency band (for example, a desired wavelength of light). Alternatively, the color filter layer 1200 may include a resin or other organic-based material having color pigments.

Figure 2A:
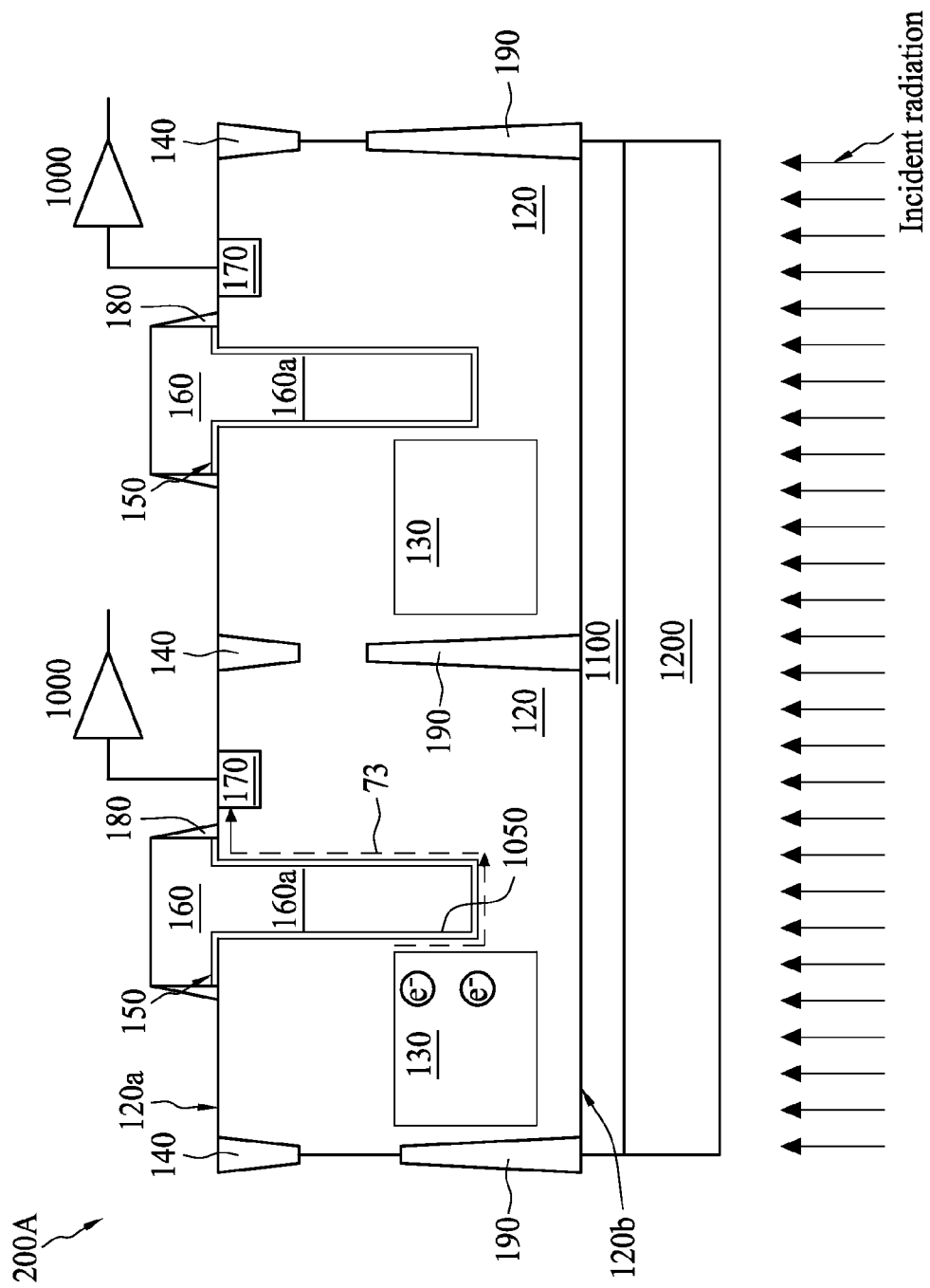
FIG. 2A is a cross-sectional view illustrating a BSI image sensor device 200A in accordance with some embodiments of the present disclosure.

Referring to FIG. 2A, a cross-sectional view illustrating a backside illuminated (BSI) image sensor device 200A in accordance with some embodiments of the present disclosure. Compared to FIG. 1, the differences between the BSI image sensor device 100 and the BSI image sensor device 200A reside in the positions of the photosensitive elements 130 as well as the depth of the plug portion 160a of the gate structure 160. Additionally, the BARC 1100 and the color filter layer 1200 of the BSI image sensor device 200A are different from those used in the BSI image sensor device 100 depicted in FIG. 1. In this illustrative embodiment, the incident radiation is designed for visible light of short wavelengths, such as green light and blue light. For example, blue wavelengths are represented by wavelengths of from about 440 nm to about 490 nm, and green wavelengths are represented by wavelengths from about 490 nm to about 570 nm. Because green wavelengths are in the center of the visible light spectrum, improving the green light transmittance of the BSI image sensor will improve the overall transmittance, and thus quantum efficiency, of all visible wavelengths. In this illustrative embodiment, the depth of the plug portion 160a of the gate structure 160 is greater than half of a thickness of the semiconductor substrate 120.

Figure 2B:
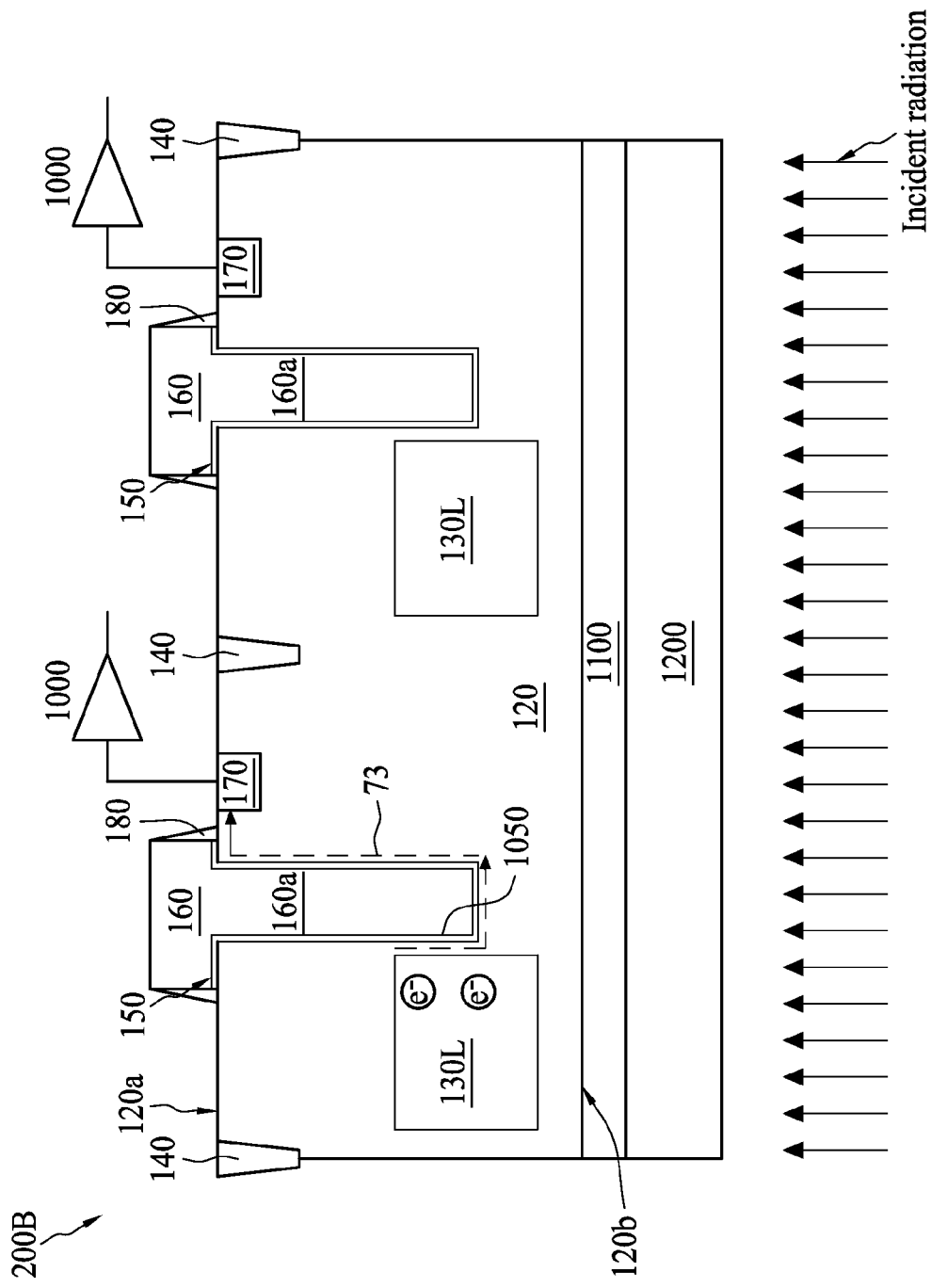
FIG. 2B is a cross-sectional view illustrating a BSI image sensor device 200B without back trench isolations (BTIs) in accordance with some embodiments of the present disclosure.

Referring to FIG. 2A, in some embodiments, short wavelengths such as green light and blue light may be quickly absorbed by the photosensitive elements 130 due to a shorter absorption length between the photosensitive elements 130 and the second surface 120b of the semiconductor substrate 120. The charges generated in the photosensitive elements 130 may experience a longer travelling path 73, as indicated by dash-dot lines in the left pixel of BSI image sensor device 200A, along the plug portions 160a of the gate structure 160. Since the incident radiation can be quickly transferred into charges and the charges can be guided to the temporary carrier depositories 170 along the plug portions 160a, BTIs 190 used to reduce the electrical crosstalk between neighboring pixels may be omitted in some embodiments. As a result, the photosensitive element used for sensing incident radiation can be enlarged. For clarification, a cross-sectional view illustrating a BSI image sensor device 200B without BTIs 190 in accordance with some embodiments of the present disclosure is shown in FIG. 2B. In FIG. 2B, a width of the photosensitive element 130L is wider than the photosensitive element 130 in FIG. 2A. The enlarged photosensitive element is critical to the integrated circuit (IC) technologies involving scaling down device geometries, especially, for small pixel size down to 1.4 μm or beyond.

Figure 3A:
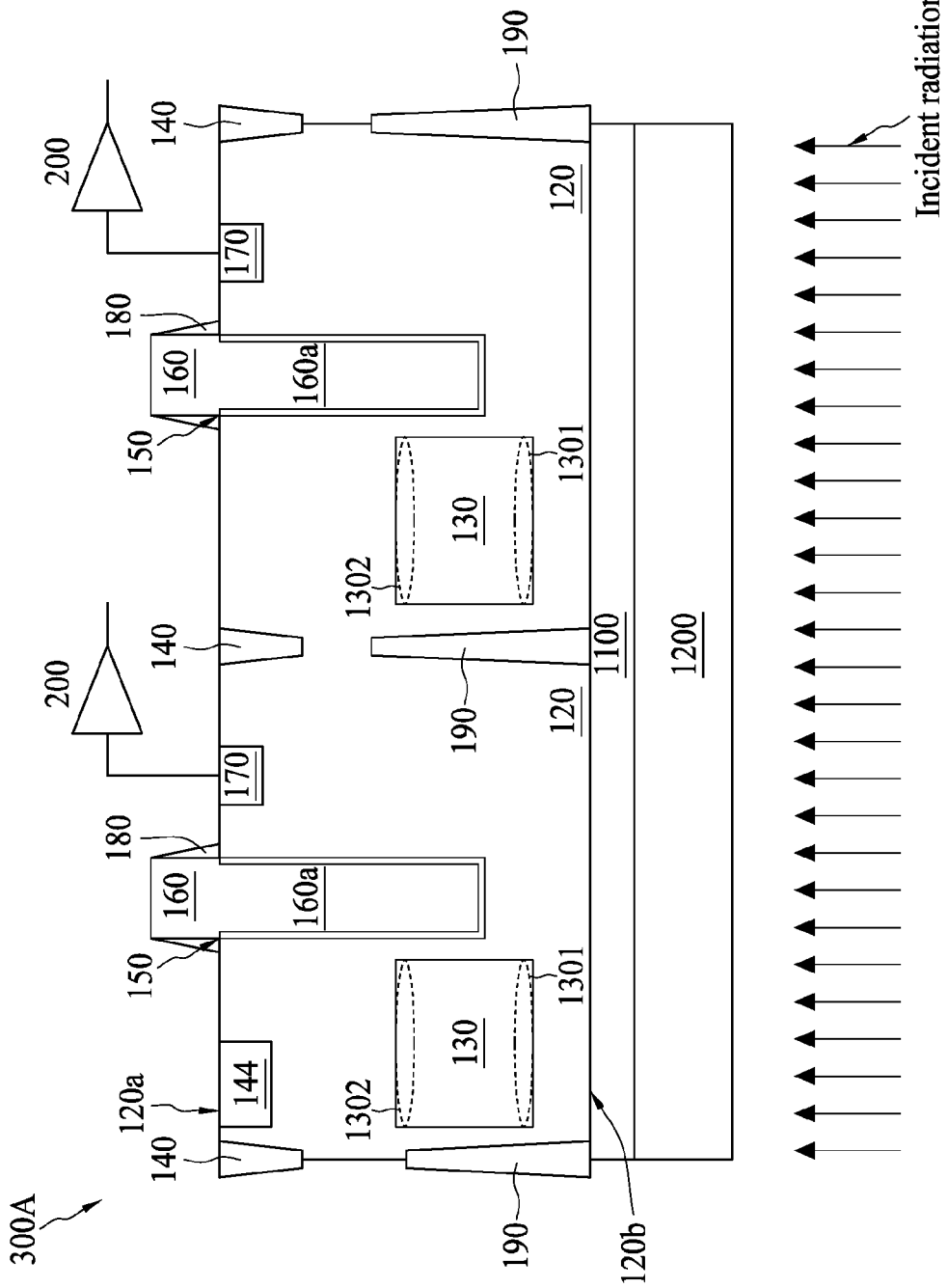
FIG. 3A is a cross-sectional view illustrating a BSI image sensor device 300A in accordance with some embodiments of the present disclosure.
Figure 3B:
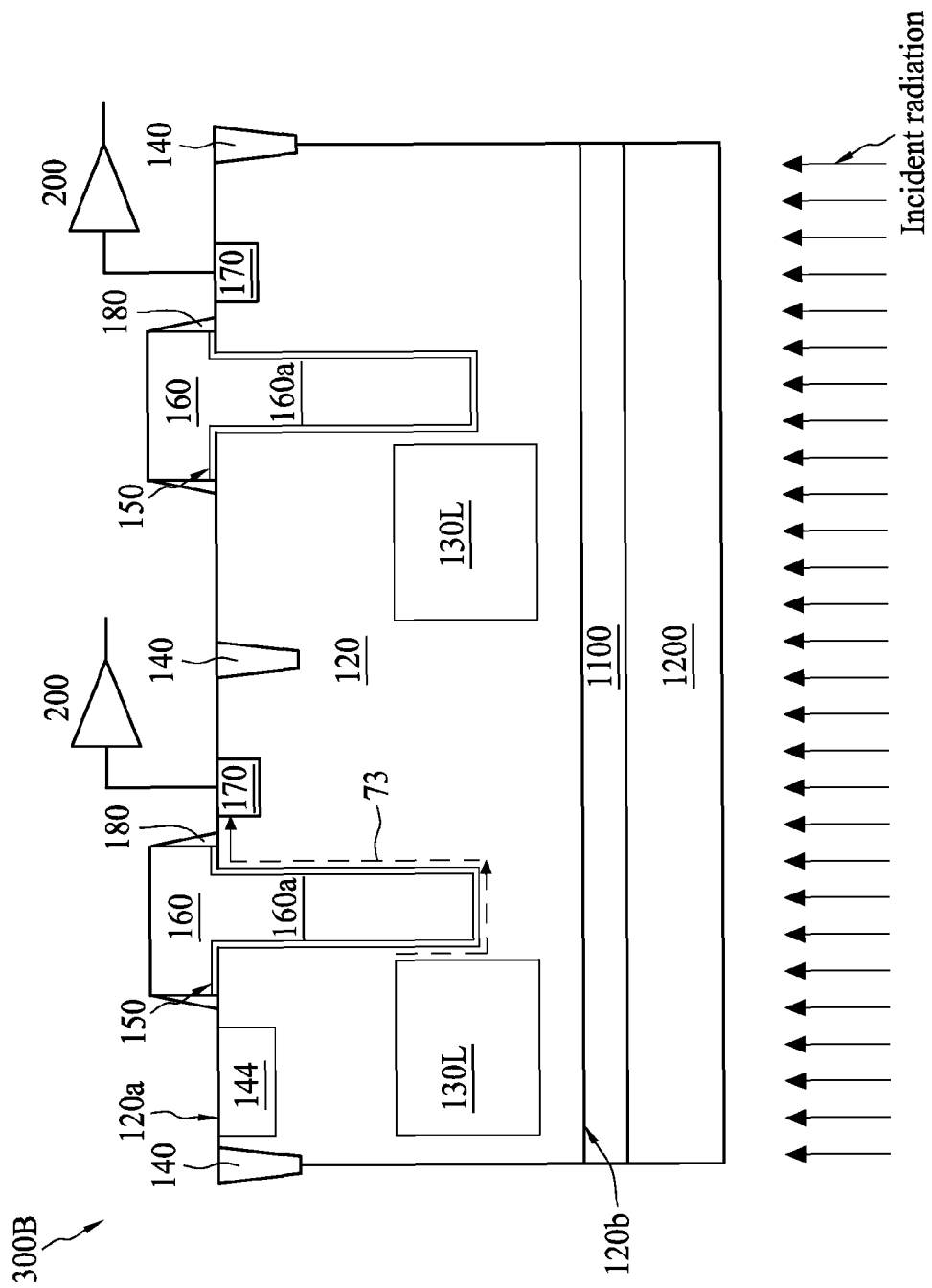
FIG. 3B is a cross-sectional view illustrating a BSI image sensor device 300B without back trench isolations (BTIs) in accordance with some embodiments of the present disclosure.

Now referring to FIG. 3A, FIG. 3A shows a cross-sectional view illustrating a backside illuminated (BSI) image sensor device 300A in accordance with some embodiments of the present disclosure. In some embodiments, a doping concentration profile of the photosensitive element 130 includes a higher doping concentration near a bottom 1301 of the photosensitive element 130 than that near a top 1302. The doping concentration profile demonstrates a gradient such that charges are guided by an electric field generated by the concentration gradient and moved upward to approach the contour of the plug portion 160a. In some embodiments, the charges include a negative charge such as an electron. Compared to FIG. 2A, the differences between the BSI image sensor device 200A and the BSI image sensor device 300A is a pinned diode disposed over the photosensitive element 130. A doped region 144 with a conductive type opposite to the photosensitive element 130 is disposed close to the first surface 120a. The pinned diode is disposed under the first surface 120a. The doped region 144 can trap charges entering the substrate through surface dangling bonds. The doped region 144 prevents the charges from migrating toward the temporary carrier depositories 170 and thus degrading the sensitivity of the photodiode. In FIG. 3B, charges are guided to move along the travelling path 73 (shown in dash dot lines). The charges travel around the contour of the plug portion 160a to reach the temporary carrier depository 170. In some embodiments, the temporary carrier depository 170 is disposed such that no photosensitive element 130 is disposed under the temporary carrier depository 170. Compared to the photosensitive element 130, the temporary carrier depository 170 is disposed at an opposite side of the plug portion 160a. On the other hand, the doped region 144 is disposed at a same side with the photosensitive element 130.

In some embodiments, the plug portion 160a has a width equal to a width of a portion of the gate structure 160 above the first surface 120a of the semiconductor substrate 120. For example, the width of the gate structure 160 may be chosen down to between about 100 nm and about 250 nm similar to the width of the plug portion 160a.

As shown in FIG. 3B, BTIs 190 in FIG. 3A may be omitted to accommodate a greater size of the photosensitive element. For clarification, a cross-sectional view illustrating a BSI image sensor device 300B without BTIs 190 in accordance with some embodiments of the present disclosure is shown in FIG. 3B. In FIG. 3B, a width of the photosensitive element 130L is wider than the photosensitive element 130 in FIG. 3A. In some embodiments, the doped region 144 includes a conductive type opposite to the conductive type of the photosensitive element 130L. The charges can be attracted to the doped region 144. The doped region 144 is disposed about a same level as the temporary carrier depository 170.

Figure 4A:
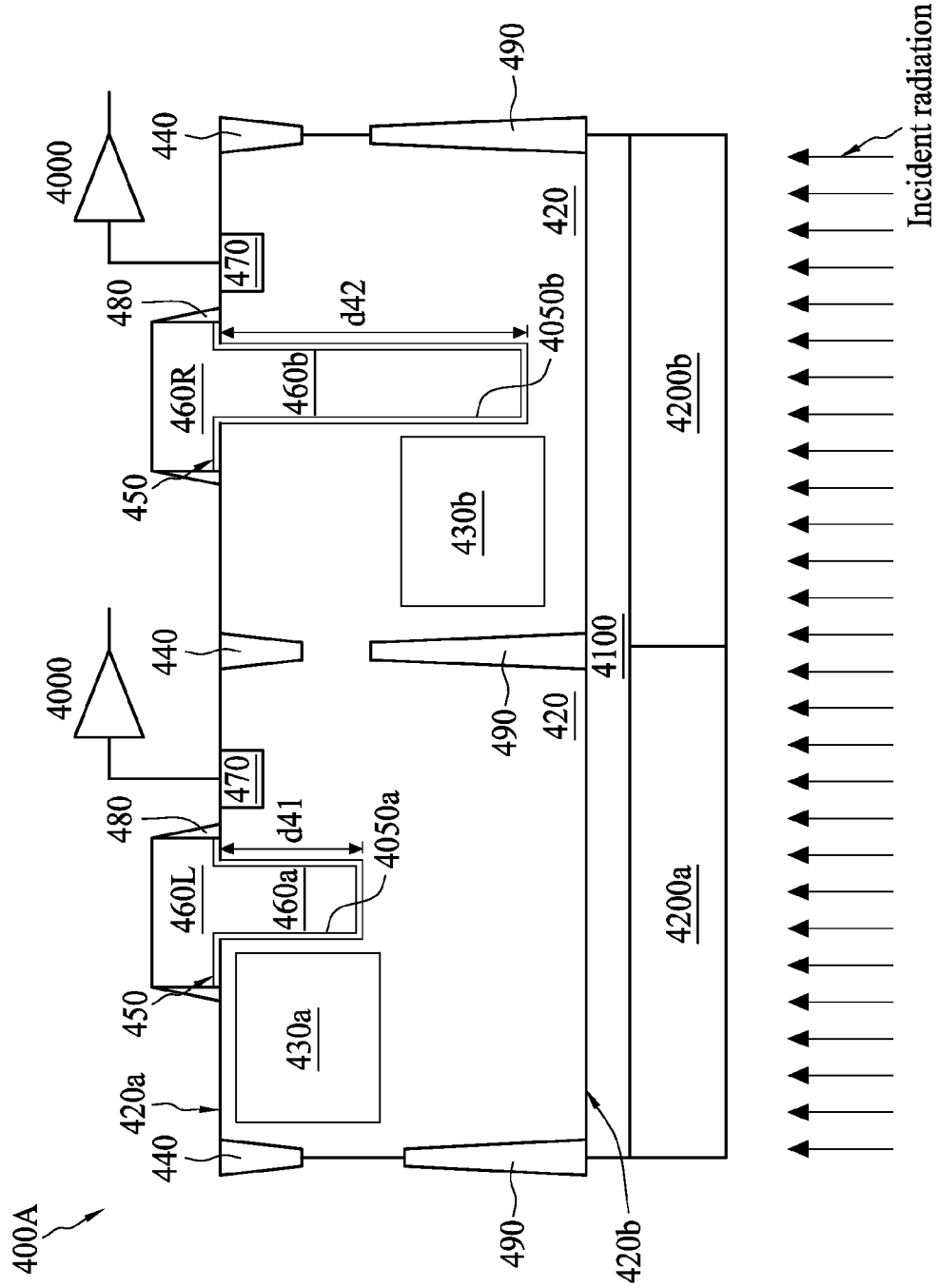
FIG. 4A is a cross-sectional view illustrating a BSI image sensor device 400A in accordance with some embodiments of the present disclosure.

Referring to FIG. 4A, a cross-sectional view illustrating a backside illuminated (BSI) image sensor device 400A in accordance with some embodiments of the present disclosure. Compared to the BSI image sensors shown in FIGS. 1, 2A, 2B, 3A, and 3B, a BSI image sensor device 400A has the photosensitive elements 430a and 430b positioned at different depths of the semiconductor substrate 420. Moreover, the depth d41 of the plug portion 460a of the gate structure 460L and the depth d42 of the plug portion 460b of the gate structure 460R are design factors with respect to different wavelengths of the incident radiation. For example, the majority of the photons of the shorter wavelengths, such as green light or blue light, have a shallow penetration depth. As a result, it is better to implant the photosensitive element 430b deep inside the semiconductor substrate 420 as shown in FIG. 4A, such that when the incident radiation illuminates on the second surface 420b of the semiconductor substrate 420 in a pixel, the photons of shorter wavelength can be quickly absorbed by the photosensitive element 430b. On the other hand, for the photons of the longer wavelengths, such as red light or IR, the majority of their photons may have a deeper penetration depth, the corresponding photosensitive element 430a may be positioned away from the second surface 420b from which the radiation enters. For example, in FIG. 4A, the photosensitive elements 430a may be suitable for sensing long wavelengths in the visible spectrum, such as red light or IR. On the other hand, the photosensitive elements 430b may be suitable for visible light of short wavelengths, such as green light and blue light.

In the present embodiment, the gate structures 460L and 460R are made of polysilicon and the dimension of the plug portions 460a and 460b may vary as a design factor according to different applications. In some embodiments, surfaces 4050a and 4050b of the plug portion 460a and 460b are laterally coupled to the photosensitive elements 430a and 430b, respectively. In some embodiment, the widths of the plug portions 460a and 460b may be between about 100 nm and about 250 nm.

Still referring to FIG. 4A, bottom-anti-reflective coatings (BARC) 4100 are disposed at the second surface 420b of the semiconductor substrate 420. The bottom-anti-reflective coatings (BARC) 4100 are similar to the BARC 1100 in FIG. 1. In the present disclosure, the BARC 4100 may be different in design depending on the wavelengths of the incident radiation.

Referring to FIG. 4A, color filter layers 4200a and 4200b overlie the second surface 420b of the semiconductor substrate 420. More specifically, the color filter layers 4200a and 4200b overlie the BARCs 4100 of the BSI image sensor device 400A. In some embodiments, the color filter layers 4200a may include a set of color filters filtering long wavelengths, such as red light and IR; and the color filter layers 4200b may include a set of color filters filtering short wavelengths, such as green light and blue light. In some embodiments, the BSI image sensor device 400A as shown in FIG. 4A may further include backside trench isolations (BTIs) 490 similar to the backside trench isolation (BTIs) 190 in FIG. 1. In this present disclosure, the device structure in FIG. 4A shows that the quantum efficiency of the BSI image sensor 400A is improved by optimizing the charge transfer efficiencies with the design of plug portions 460a and 460b depending on the wavelengths of the incident radiation as well as the positions of the photosensitive elements 430a and 430b.

Figure 4B:
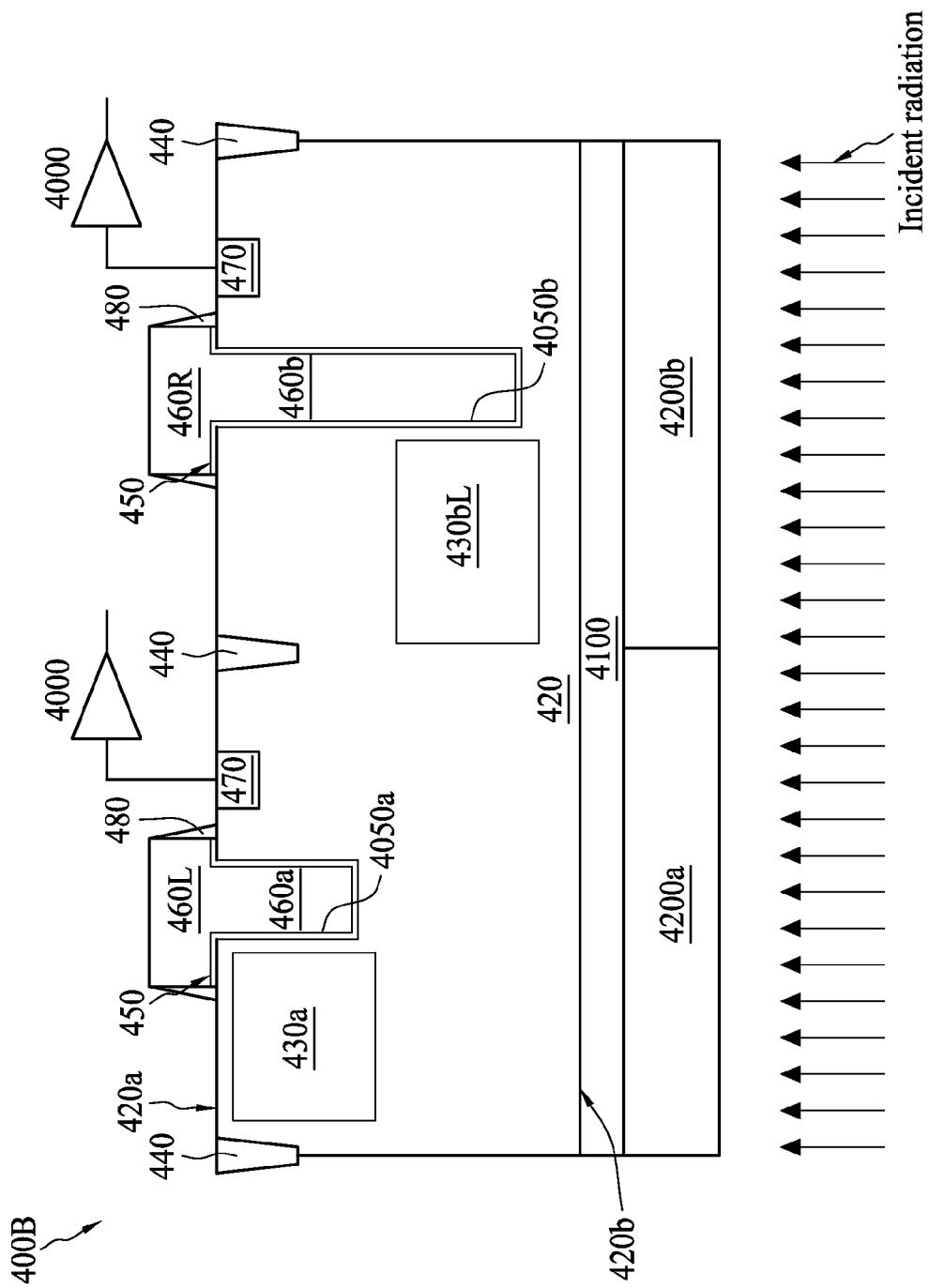
FIG. 4B is a cross-sectional view illustrating a BSI image sensor device 400B without back trench isolations (BTIs) in accordance with some embodiments of the present disclosure.

Now referring to FIG. 4B, a cross-sectional view illustrating a BSI image sensor device 400B without back trench isolations (BTIs) in accordance with some embodiments of the present disclosure is shown. In the illustrative embodiment, charges generated by the incident radiation can be quickly transferred and guided to the temporary carrier depositories 470 along the plug portions 460a and 460b, respectively. Thus, BTIs 490 used to reduce the electrical crosstalk between neighboring pixels may be omitted. In some embodiment, a width of the photosensitive element 430bL used for sensing incident radiation, especially for long wavelengths, can be enlarged. For clarification, an enlarged photosensitive element 430bL is shown in FIG. 4B. 4 In some embodiments a width of the photosensitive element 430bL in FIG. 4B is larger than that of the photosensitive element 430b in FIG. 4A. In some embodiments, the photosensitive element 430a in FIG. 4B includes a size substantially equal to a size of the photosensitive element 430a in FIG. 4A.

Figure 5A:
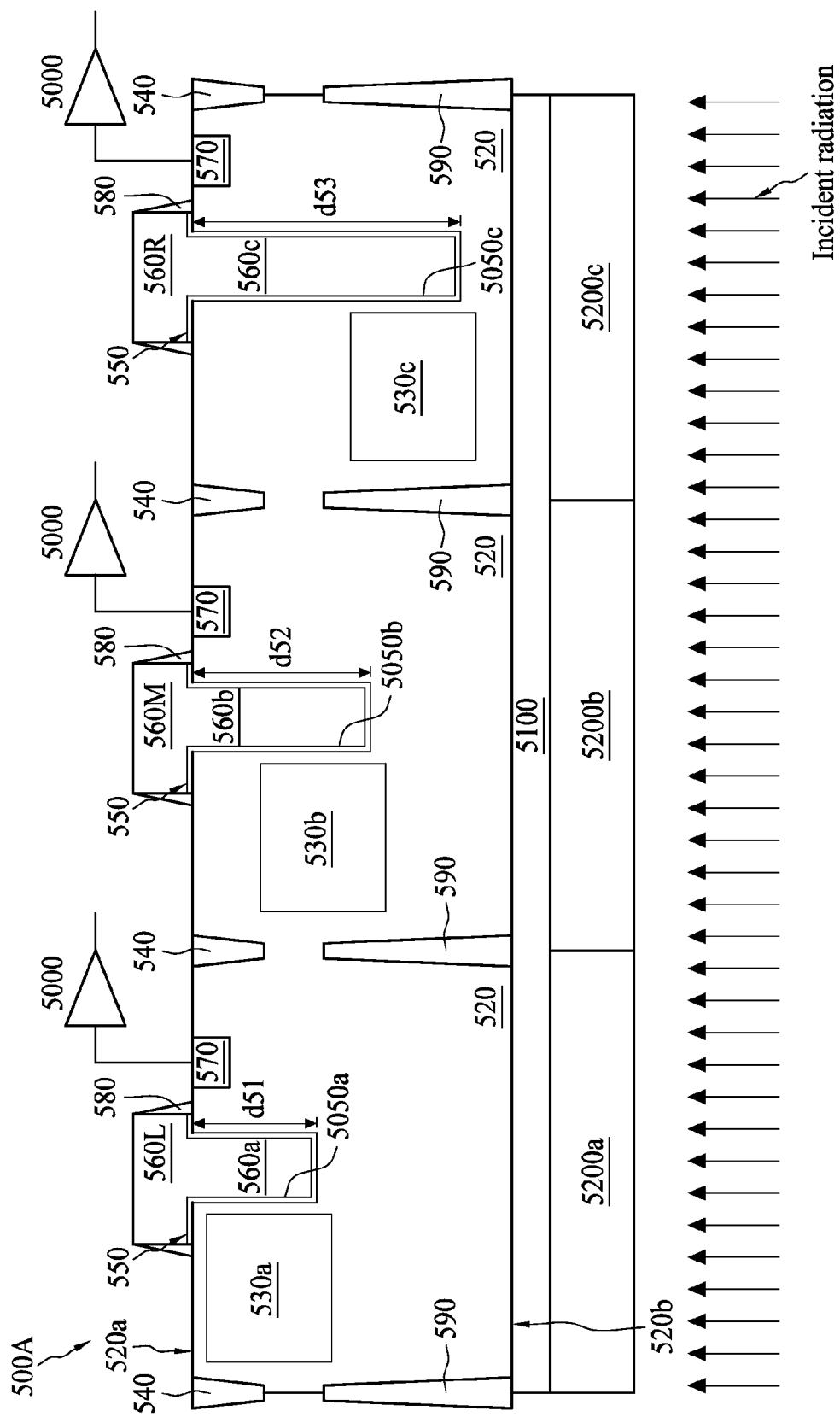
FIG. 5A is a cross-sectional view illustrating a BSI image sensor device 500A in accordance with some embodiments of the present disclosure.

Referring to FIG. 5A, a cross-sectional view illustrating a backside illuminated (BSI) image sensor device 500A in accordance with some embodiments of the present disclosure. Compared to the BSI image sensors shown in FIG. 4A, a BSI image sensor device 500A has three photosensitive elements 530a, 530b, and 530c instead of two, which are formed in different depths inside the semiconductor substrate 520. Depending on the wavelengths of the incident radiation, the depth of the plug portion 560a of the gate structure 560L is designed as d51, the plug portion 560b of the gate structure 560M is designed as d52, and the plug portion 560c of the gate structure 560R is designed as d53. For example, the photosensitive elements 530a may be suitable for visible light of long wavelengths, such as visible light of red light or IR; the photosensitive elements 530b may be suitable for visible light of short wavelengths, such as green light and blue light; and the photosensitive elements 530c may be suitable for shorter wavelengths, such as UV.

In the present embodiment, the gate structures 560L, 560M, and 560R are made of polysilicon and the dimensions of the plug portions 560a, 560b, and 560c may vary as a design factor according to different applications. In some embodiments, surfaces 5050a, 5050b, and 5050c of the plug portion 560a, 560b, and 560c are laterally coupled to the photosensitive elements 530a, 530b, and 530c, respectively. In some embodiment, the widths of the plug portions 560a, 560b and 560c may be between about 100 nm and about 250 nm.

Still referring to FIG. 5A, a bottom-anti-reflective coating (BARC) 5100 is disposed at the second surface 520b of the semiconductor substrate 520. In the depicted embodiment, the BARC 5100 directly contact the second surface 520b of the semiconductor substrate 520. Alternatively, one or more layers may be disposed between the BARC 5100 and the second surface 520b of the semiconductor substrate 520. In some embodiments, the BARC 5100 can be dielectric layers, such as a silicon carbide (SiC) layers. In some embodiments, the BARC 5100 is similar to the BARC 4100 in FIG. 4A. In the present disclosure, the BARC 5100 may be different in design depending on the wavelengths of the incident radiation.

Referring to FIG. 5A, color filter layers 5200*a*, 5200*b*, and 5200*c* overlie the second surface 520*b* of the semiconductor substrate 520. More specifically, the color filter layers 5200*a*, 5200*b*, and 5200*c* overlie the BARC 5100, respectively, of the BSI image sensor device 500A. In some embodiments, the color filter layers 5200*a* may include a set of color filters filtering long wavelengths, such as red light and IR; the color filter layers 5200*b* may include a set of color filters filtering short wavelengths, such as green light and blue light; and the color filter layers 5200*c* may include a set of color filters filtering shorter wavelengths, such as UV. In some embodiments, the BSI image sensor device 500A as shown in FIG. 5A may further include backside trench isolations (BTIs) 590 similar to the backside trench isolation (BTIs) 190 in FIG. 1.

Figure 5B:
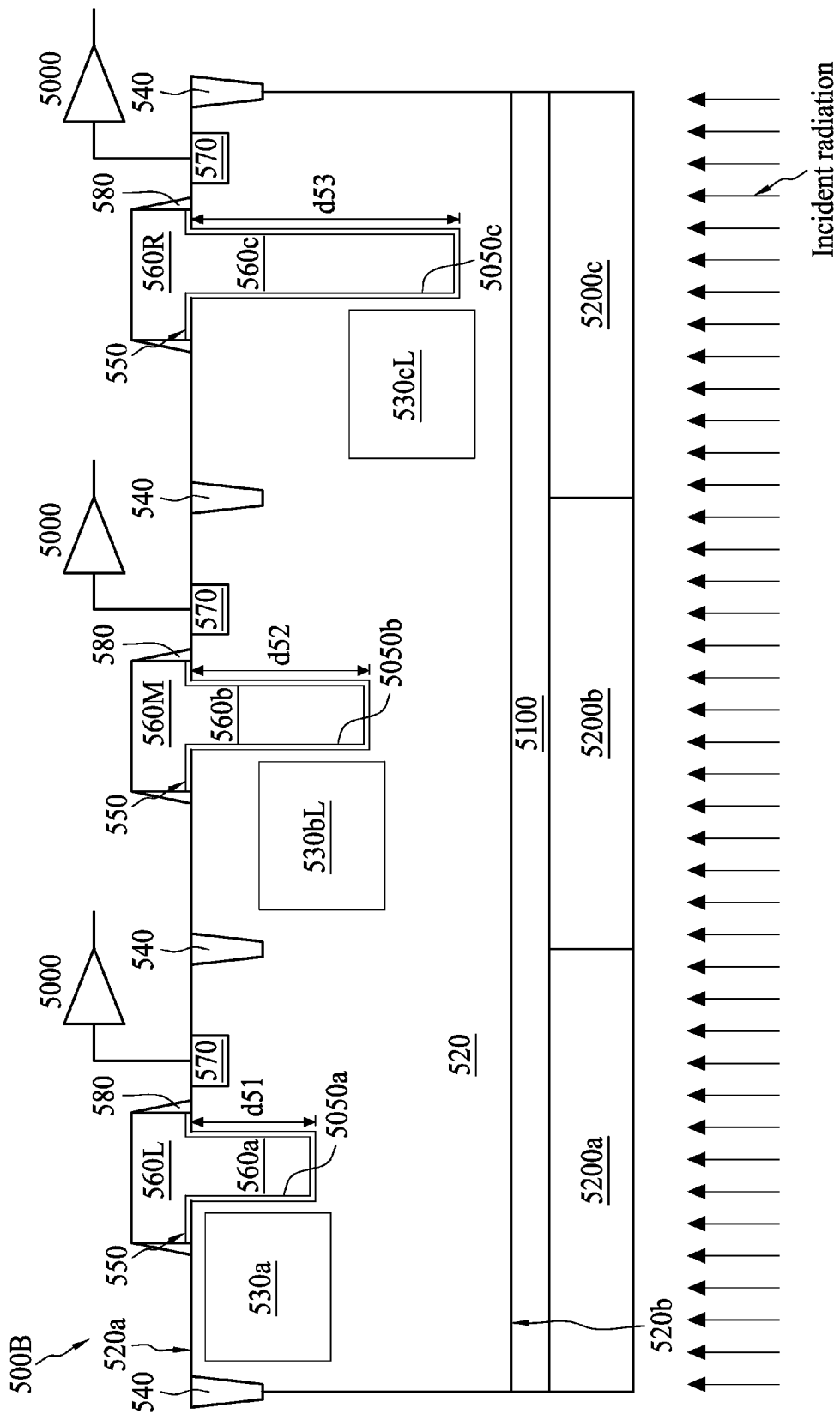
FIG. 5B is a cross-sectional view illustrating a BSI image sensor device 500B without back trench isolations (BTIs) in accordance with some embodiments of the present disclosure.

Now referring to FIG. 5B, a cross-sectional view illustrating a BSI image sensor device 500B without back trench isolations (BTIs) in accordance with some embodiments of the present disclosure is shown. In the illustrative embodiment, charges generated by the incident radiation can be quickly transferred and guided to the temporary carrier depositories 570 along the plug portions 560*a*, 560*b*, and 560*c*, respectively; thus, BTIs 590 used to reduce the electrical crosstalk between neighboring pixels may be omitted. In some embodiment, a width of the photosensitive element 530*b*L used for sensing incident radiation, especially for long wavelengths, can be enlarged. For clarification, enlarged photosensitive elements 530*b*L and 530*c*L are shown in FIG. 5B. In some embodiments, in FIG. 5B, a width of the photosensitive element 530*b*L is greater than that of the photosensitive element 530*b* in FIG. 5A. In FIG. 5B, the photosensitive element 530*c*L is larger than the photosensitive element 530*c* in FIG. 5A. The range of the width enlargement can be a design factor and as long as the photosensitive element not crossing to an adjacent pixel, the width enlargement is considered proper under the scope of the present disclosure. In the present disclosure, the sensitivity of the BSI image sensor device 500B may be improved due to the enlarged photosensitive elements 530*b*L and 530*c*L since more charges are generated and as a result, producing a better signal output.

Figure 6:
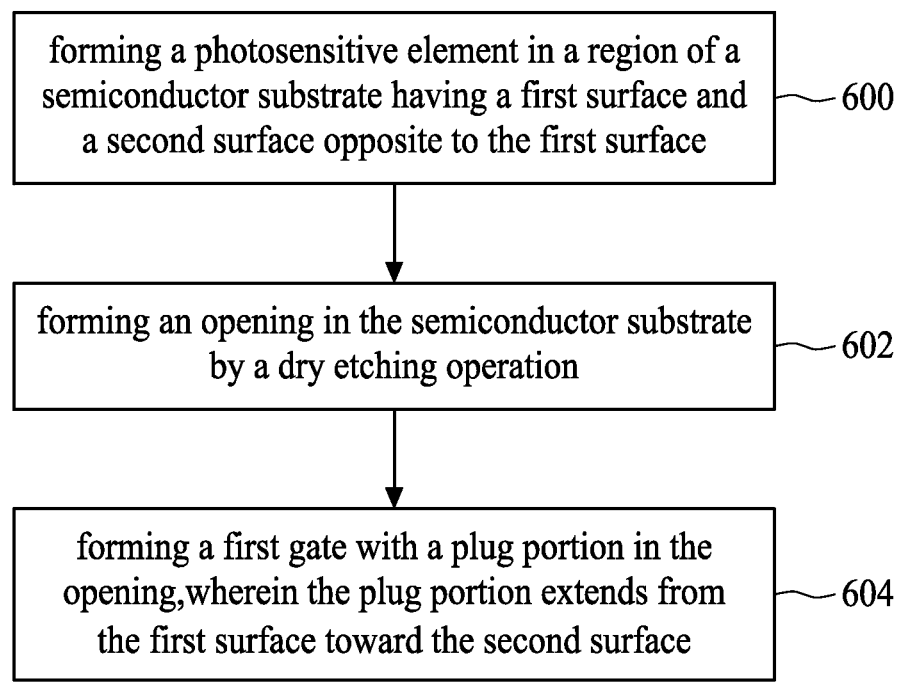
FIG. 6 is a simplified flow diagram for forming a BSI image sensor device, in accordance with some embodiments of the present disclosure.

Referring to FIG. 6, a simplified flow diagram concerning the operations for forming a BSI image sensor device is shown. For a detailed description, cross sectional views for forming a BSI image sensor device illustrated in FIGS. 1-3 are shown in FIGS. 7A-7K.

The manufacturing method starts by providing a substrate, which may be a p-type substrate, an n-type substrate, and may include various doped regions therein.

Figure 7A:
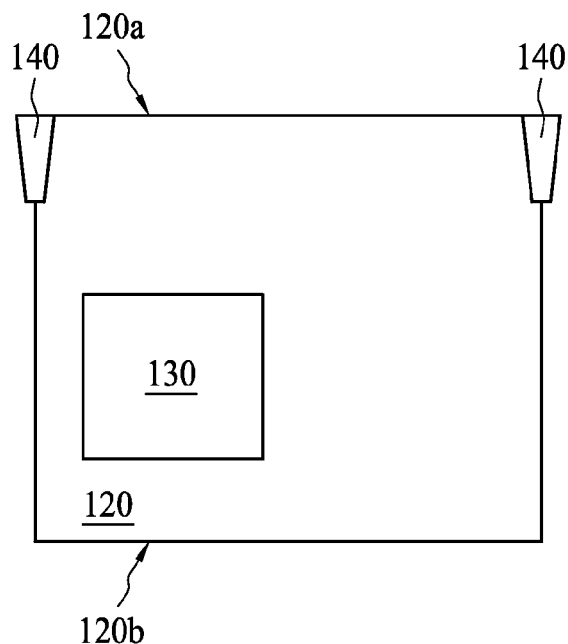
FIGS. 7A to 7K are cross sectional views of sequential operations for forming a BSI image sensor according to the flow diagram of FIG. 6.
Figure 7B:
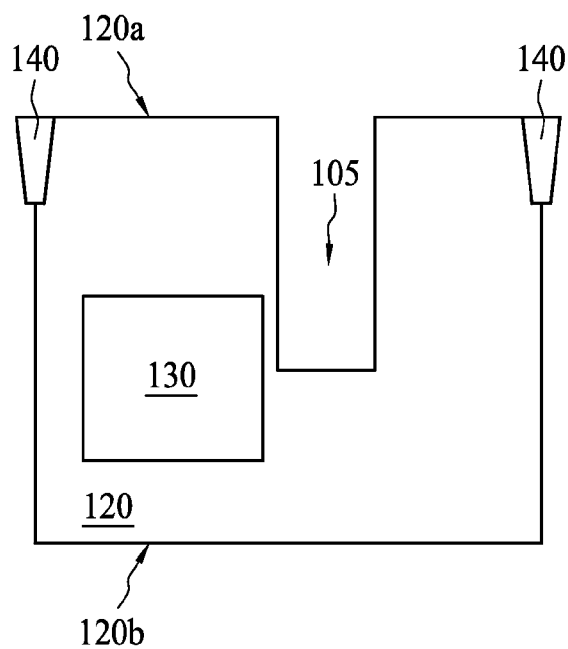

Operation 600 in FIG. 6 provides a semiconductor substrate 120 having a photosensitive element 130; for clarity, the cross sectional view of the BSI image sensor at this stage is also shown in FIG. 7A and FIG. 7B. The substrate is patterned to form STIs 140 in proximity to the first surface 120*a* of the semiconductor substrate 120. The semiconductor substrate 120 may be patterned using processes known in the art or techniques to be developed in the future. One example is by applying a photoresist layer on the semiconductor substrate 120 and patterned using a lithography process. Then, etching operations are performed on the semiconductor substrate 120 to form the STIs 140. In some embodiments, the depths of the STIs 140 may be optimized according to different applications. It is also understood that a chemical mechanical planarization (CMP) may be performed to planarize the semiconductor substrate 120, such that the surfaces of the STIs 140 are substantially coplanar with the first surface 120*a* of the semiconductor substrate 120 as shown in FIG. 7A.

Once the STIs 140 are formed, the process continues to form photosensitive elements 130 in the semiconductor substrate 120 at a predetermined position as shown in FIG. 7A. The photosensitive elements 130 may be formed by implantation methods known in the art. In some embodiments, the implantation forms a grading doping concentration profile. In other embodiments, the photosensitive element 130 may be formed by an epitaxial growth. For example, the epitaxial growth may form epitaxy layers in-situly doped with different dopants at various concentrations. In other embodiments, the semiconductor substrate 120 can be etched to form openings to be deposited with materials such as SiGe.

Next, at operational 602 in FIG. 6, the semiconductor substrate 120 is designed to form an opening 105 in the semiconductor substrate 120. Herein, the semiconductor substrate 120 may be patterned using operations known in the art. Referring to FIG. 7B, an opening 105 is formed in the semiconductor substrate 120, for example, by dry etching operations or any other well-known techniques. Additionally, the depth of the opening 105 as well as the distance between the photosensitive element 130 and the opening 105 may be controlled at this operation. Opening 105 is formed in the semiconductor substrate 120 before forming gate structure 160 and the plug portions 160*a* thereof.

Figure 7C:
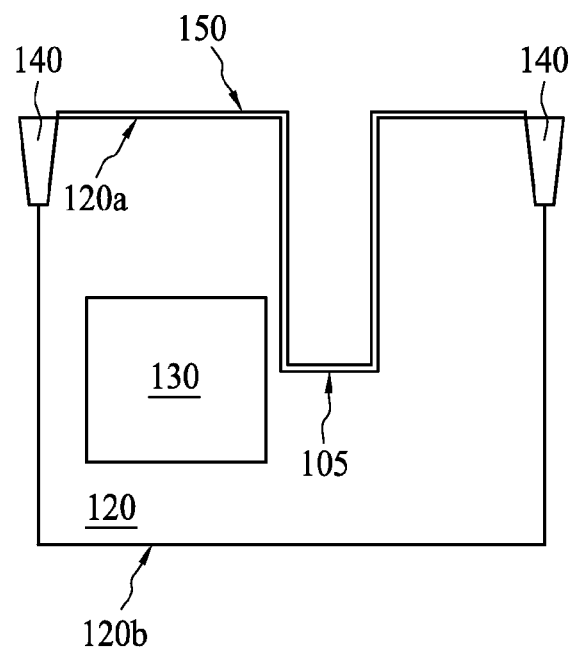

Once the opening 105 is formed, a gate dielectric layer 150 may be deposited in the openings 105 as shown in FIG. 7C. The gate dielectric layer 150 may be formed by a chemical vapor deposition (CVD), physical vapor deposition (PVD), atomic layer deposition (ALD), spin-on coating, other proper operation, or combinations thereof. In FIG. 7C, a gate dielectric 150 is blanket deposited over the first surface 120*a* of the semiconductor substrate 120 and the bottom and sidewall of the opening 105 for a predetermined thickness.

In FIGS. 7D to 7G, the gate structure 160 and the plug portion 160*a* thereof are formed by any conductive material suitable for a particular application. The plug portions 160*a* may be deposited first and be formed of any suitable conductive material. Materials that may be suitable include, for example, polysilicon, doped polysilicon, aluminum, copper, or the like. Once the plug portion 160*a* is filled to the same level as the first surface 120*a* of the semiconductor substrate 120, the deposition process continues to complete the gates structures 160.

Figure 7D:
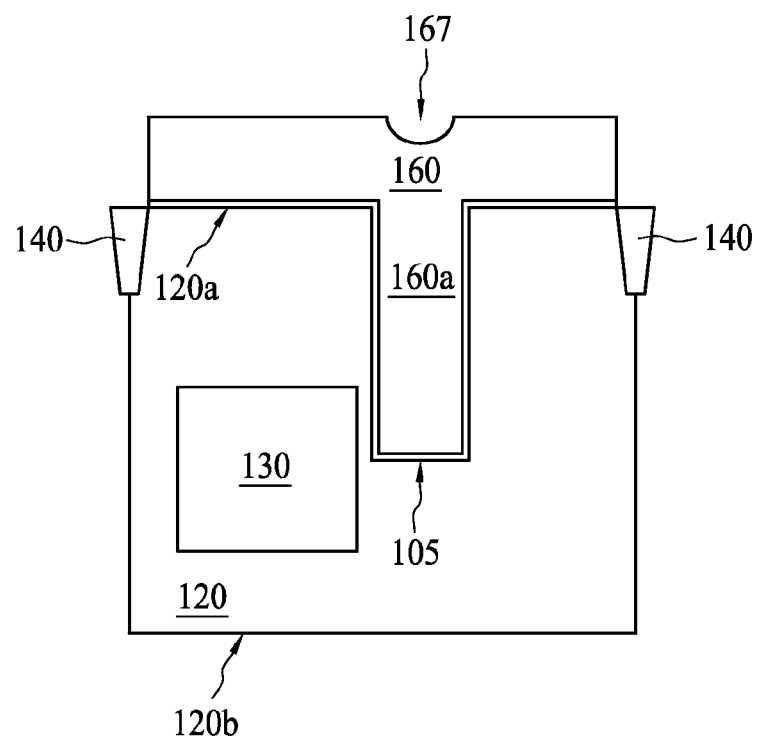
Figure 7E:
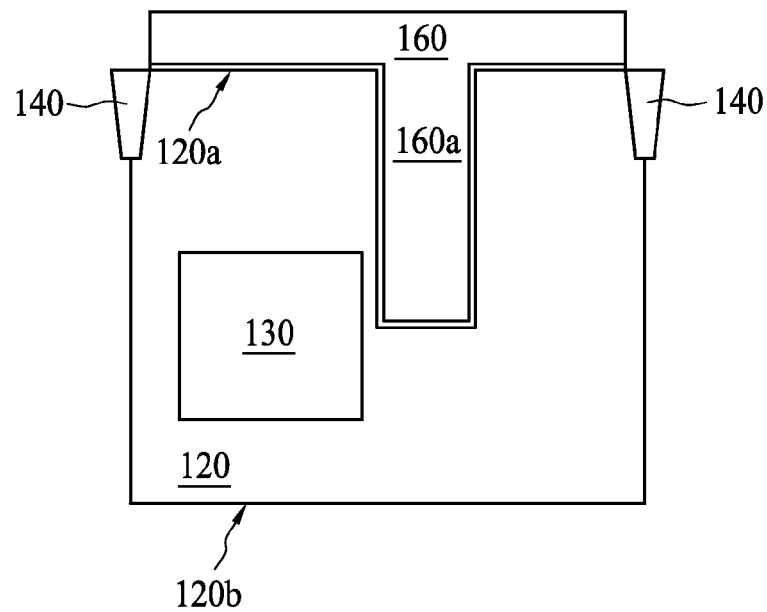
Figure 7F:
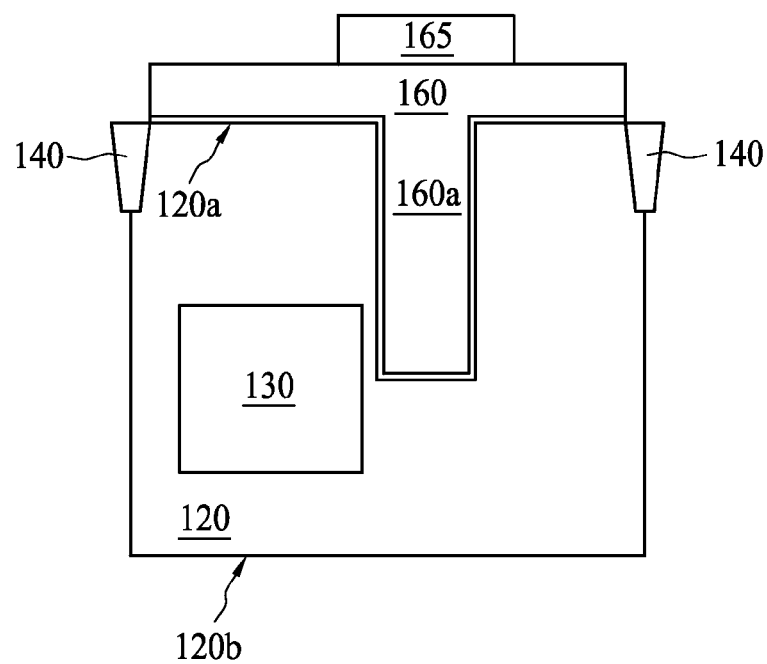
Figure 7G:
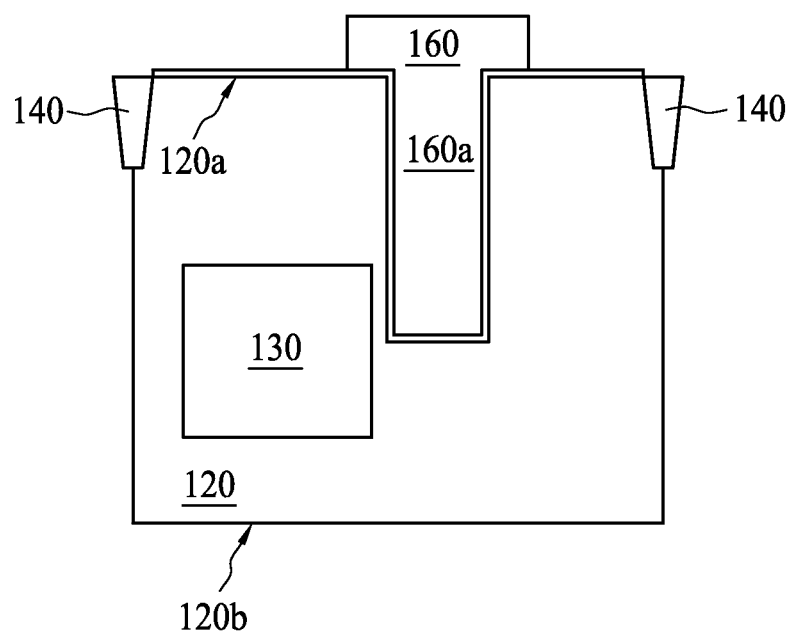
Figure 7H:
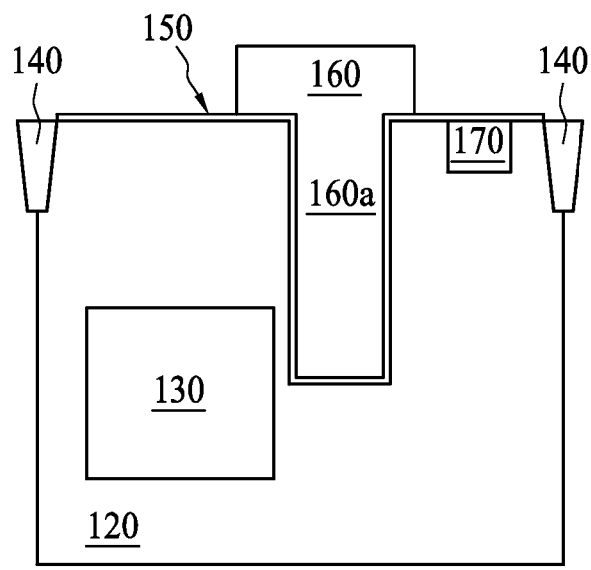
Figure 7I:
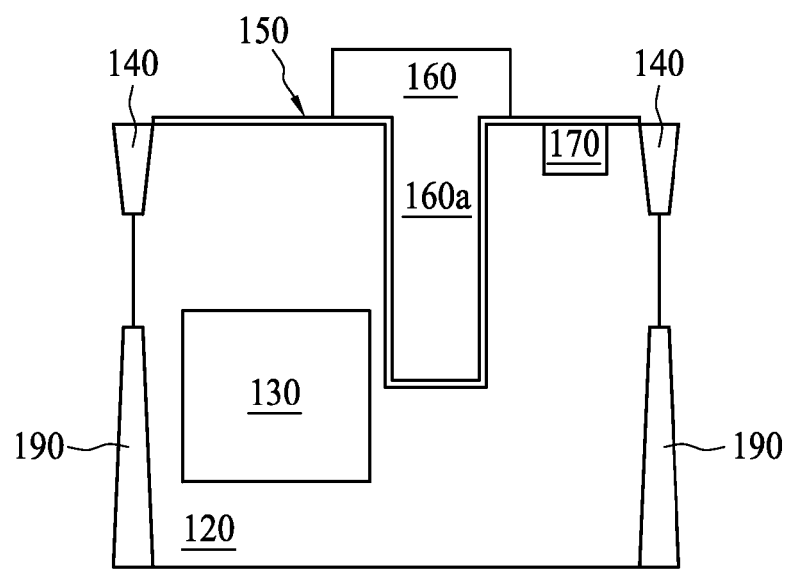

Referring to FIG. 7D, a blanket layer of gate material is formed over the gate dielectric 150. In some embodiments, a recess 167 is formed in the gate material over the opening 105, and a planarization operation is performed, as shown in FIG. 7E, to remove the recess 167 in order to obtain a planar top profile of the deposited gate material. Referring to FIG. 7F, a hard mask 165 is patterned over the plug portion 160*a*, defining a gate width of the gate structure 160, and rendering a patterned gate structure 160 as shown in FIG. 7G by performing an anisotropic etch operation that removes the portion of the gate material not covered by the hard mask 165. In some embodiments, the gate material is removed such that a portion of the gate dielectric 150 not under the hard mask 165 is exposed. In some embodiments, the exposed portion of the gate dielectric 150 remains on top of the semiconductor substrate 120. It is understood that the plug portion 160*a* has a smaller or equal width compared to the portions of the gate structure 160 above the first surface 120a of the semiconductor substrate 120. The temporary carrier depositories 170 are formed in proximity to the first surface 120a of the semiconductor substrate 120, as shown in FIG. 7H. Additionally, temporary carrier depositories 170 may be used to connect to a processing unit for outputting electrical signals. Once the temporary carrier depositories 170 are formed, the process continues to form the backside trench isolations (BTIs) 190 positioned between the neighboring pixels, as shown in FIG. 7I. Typically, a BTI 190 is a trench extending into a predetermined depth of the semiconductor substrate 120 and filled with oxide or other dielectric materials. In the present embodiment, the present of the BTIs 190 may depend on the possibility and tendency of signal crosstalk. For example, when the size of the pixel gets smaller and smaller, it may involve more crosstalk between neighboring pixels.

Figure 7J:
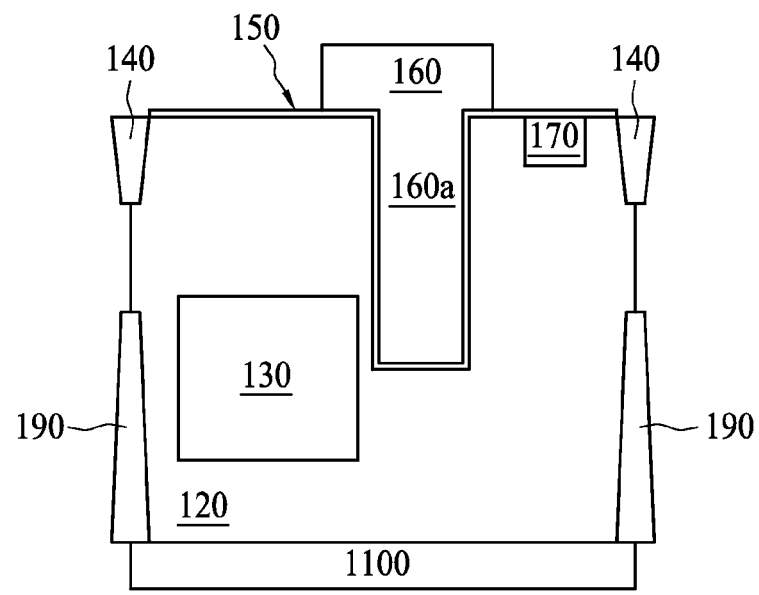
Figure 7K:
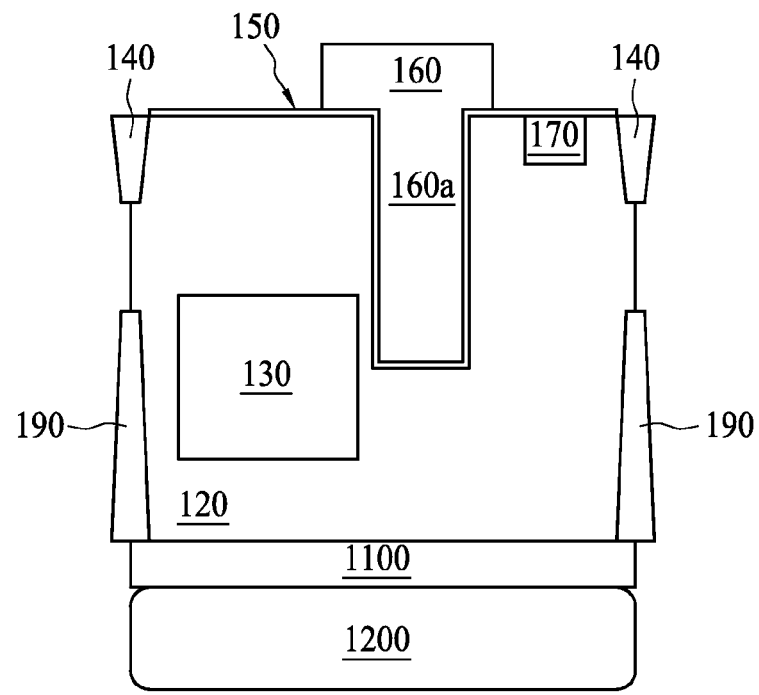

Next, as shown in FIG. 7J, a bottom-anti-reflective coating (BARC) 1100 is formed at the second surface 120b of the semiconductor substrate 120 at operation 816. In the depicted embodiment, the BARC 1100 directly contacts the second surface 120b of the semiconductor substrate 120. A composition, an index of refraction, and an extinction coefficient of the BARC 1100 can be tuned so that the BSI image sensor device exhibits optimal quantum efficiency. Then, a color filter layer 1200 is formed over the BARC 1100 to adjust the performance of the BSI image sensor as shown in FIG. 7K.

Figure 8:
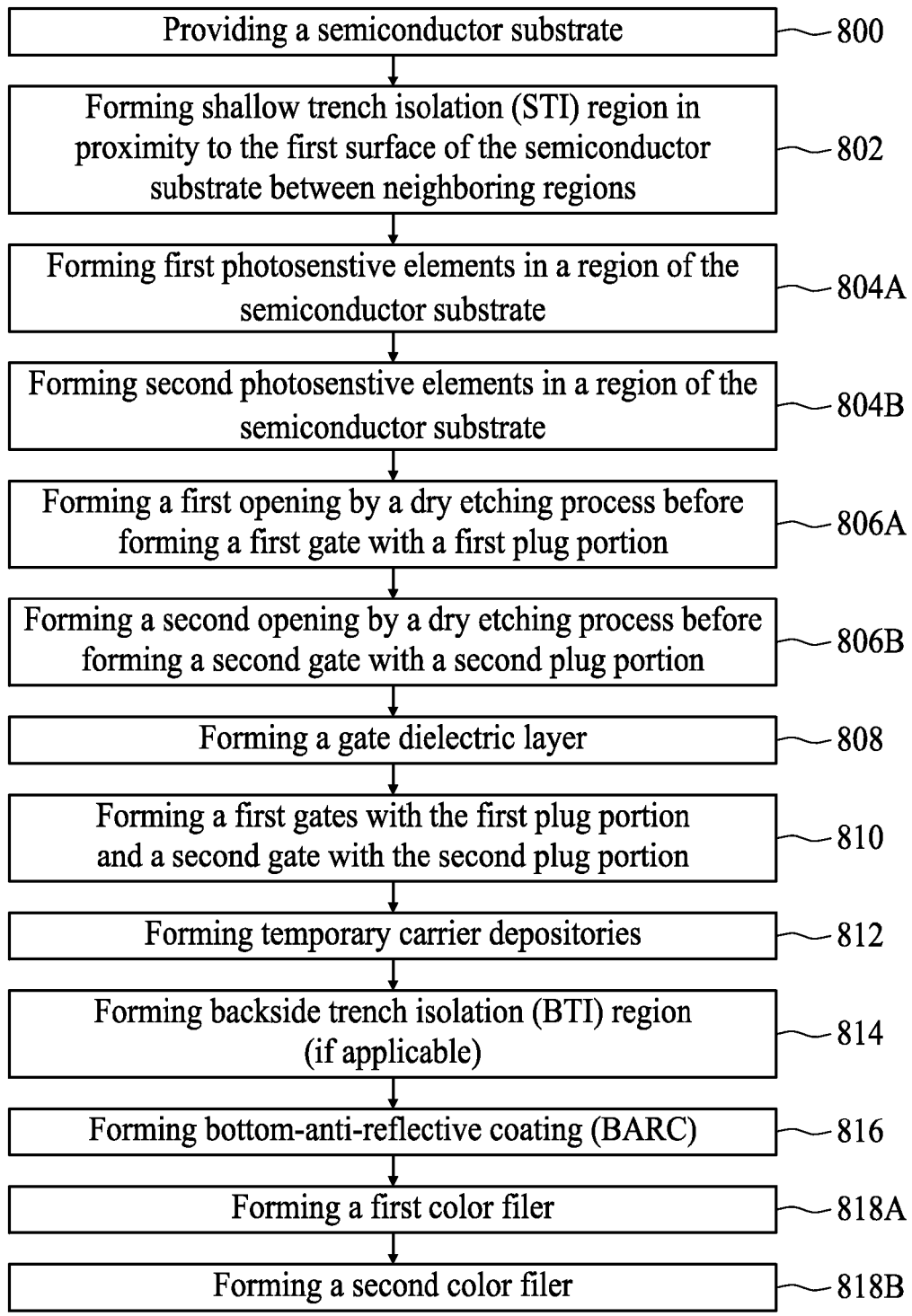
FIG. 8 is a flow diagram for forming a BSI image sensor device illustrated in FIGS. 4A and 4B in accordance with some embodiments of the present disclosure.

Referring to FIG. 8 and FIGS. 4A-4B, a flow diagram for forming a BSI image sensor device illustrated in FIGS. 4A and 4B is shown. The process begins at operation 800 by providing a semiconductor substrate 420, which may be a p-type substrate, an n-type substrate, and may include various doped regions therein. Next, the semiconductor substrate 420 is patterned to form STIs 440 in proximity to the first surface 420a of the semiconductor substrate 420 at operation 802. The semiconductor substrate 420 may be patterned using operations known in the art or techniques to be developed in the future. One example is by applying a photoresist layer on the substrate and patterned using a lithography operation. Then, etching is performed on the substrate to form the STIs 440. In some embodiments, the depths of the STIs 440 may be optimized according to different applications. It is also understood that a chemical mechanical planarization (CMP) may be performed to planarize the semiconductor substrate 420, such that the surfaces of the STIs 440 are substantially coplanar with the first surface 420a of the semiconductor substrate 420. Once the STIs 440 are formed, the process continues to operation 804A, where a first photosensitive element 430a is formed in the semiconductor substrate 420 of the left pixel, with the predetermined position. Next, at operation 804B, where a second photosensitive element 430b (or 430bL) is formed in the semiconductor substrate 420 of the right pixel, with the predetermined position. The photosensitive elements 430a and 430b (or 430bL) may be formed by implantation methods known in the art. In some embodiment, the size difference between photosensitive element 430b in FIG. 4A and 430bL in FIG. 4B may be determined by the existence of the BTIs 490 or the pixel size of the BSI image sensor.

At operation 806A, a first opening is formed before forming the gate structure 460L. Next, at operation 806B, a second opening is formed before forming the gate structure 460R. One method of forming openings is by a dry etching operation. In some embodiments, the first opening and the second opening possess different depths, respectively. A first mask can be designed to form the first opening including a depth such as the depth d41, and subsequently, a second mask can be designed to form the second opening including a depth such as the depth d42. The depth d42 is greater than the depth d41.

Figure 9A:
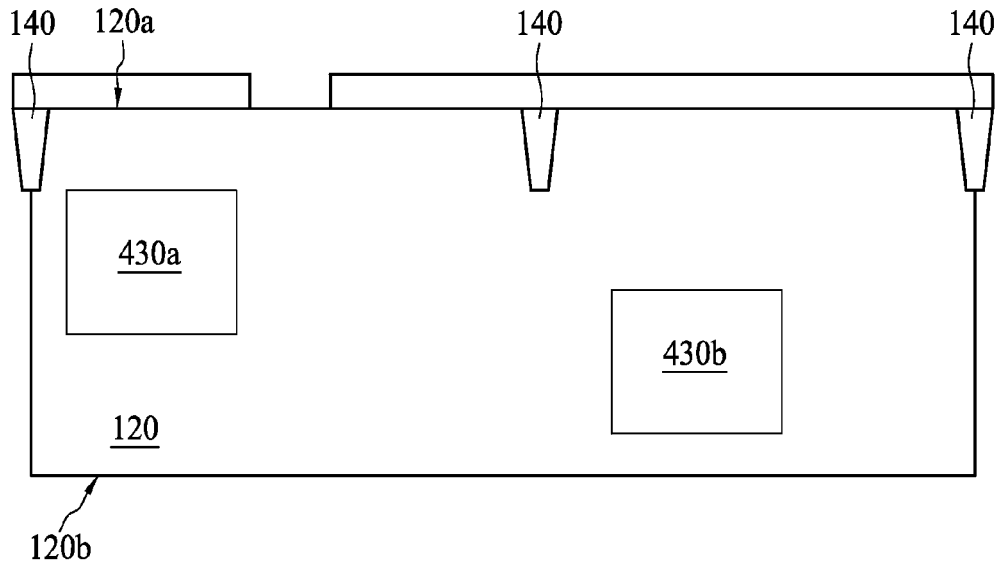
FIGS. 9A to 9D are cross sectional views of operations for forming a BSI image sensor according to the flow diagram of FIG. 8.
Figure 9B:
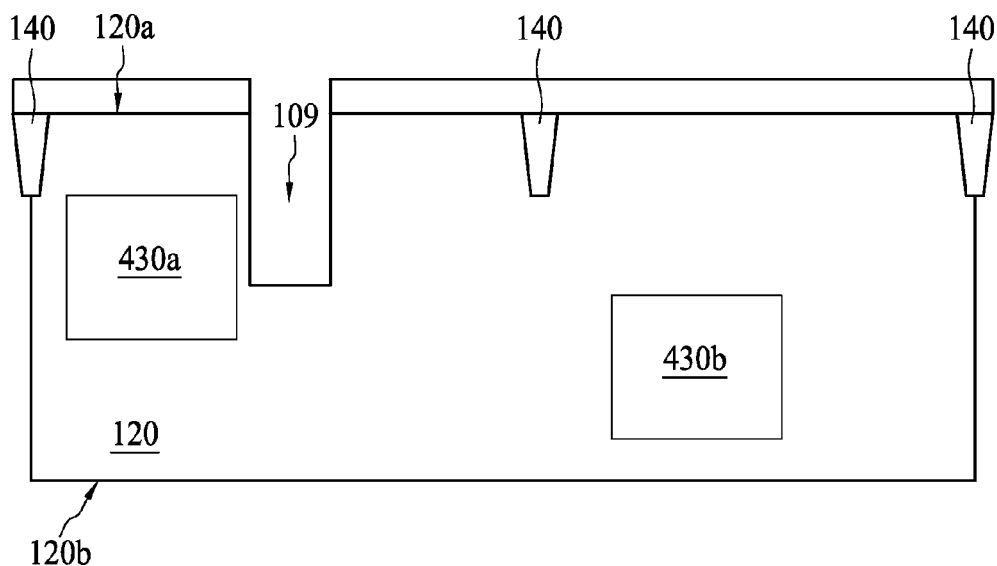
Figure 9C:
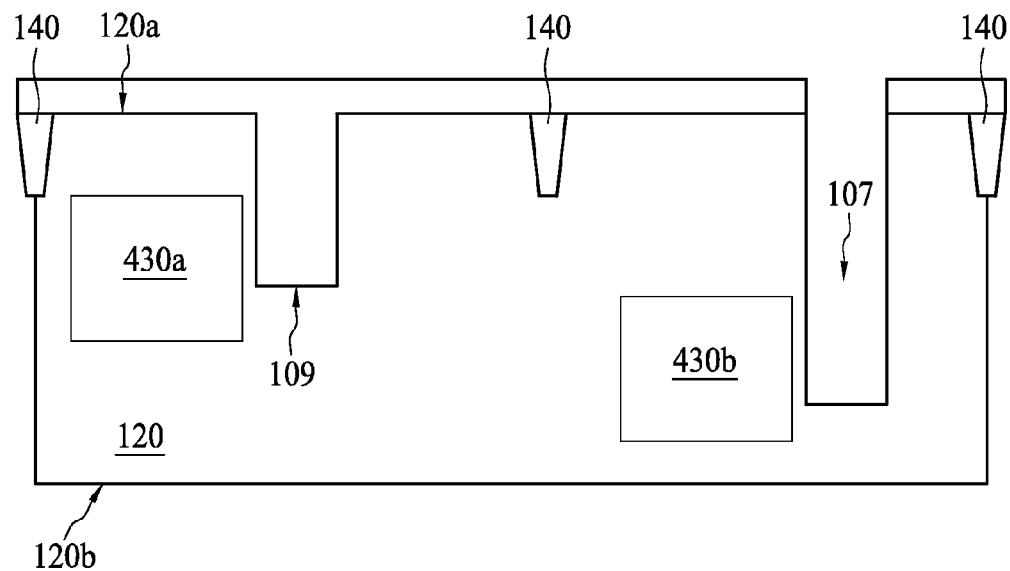
Figure 9D:
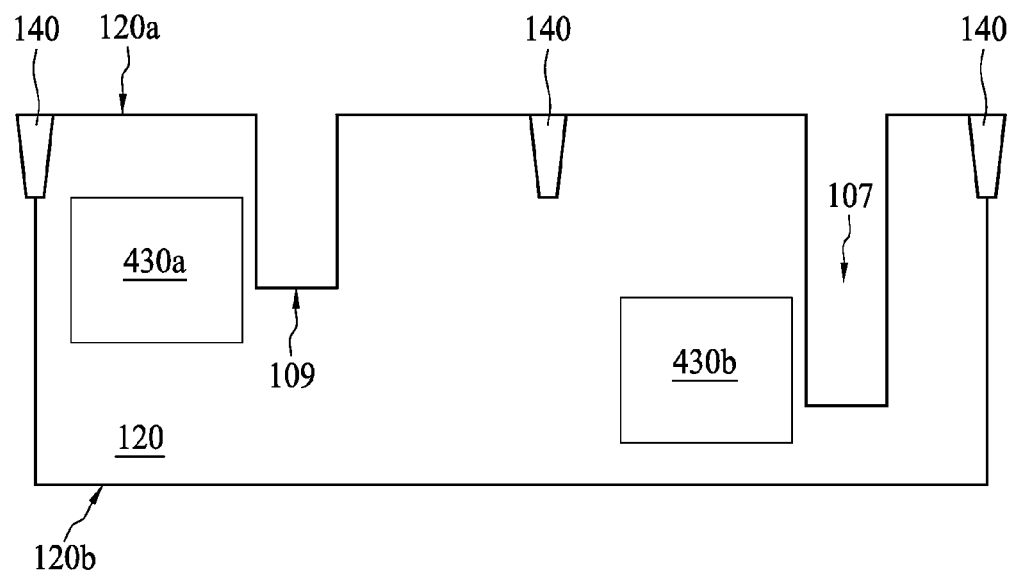

In some embodiments, operations of forming openings including different depths such as the operation 806A and the operation 806B in FIG. 8 are further illustrated in FIG. 9A-9D. In FIG. 9A, a first mask on the semiconductor substrate 120 forms the first opening 109 by a first etching as shown in FIG. 9B. In FIG. 9C, a second mask forms on the semiconductor substrate 120 covers the first opening 109 and expose a portion of the semiconductor substrate 120 to form the second opening 107. The second opening 107 is etched deeper than the first opening 109 by a second etching. The second mask is removed after the second etching to expose the first opening 109 and the second opening 107 as shown in FIG. 9D.

Operation 810 in FIG. 8 deposits the plug portion 460a and the gate structure 460L, and subsequently, the plug portion 460b and the gate structure 460R. Once the openings are formed, a gate dielectric layer 450 may be deposited in the first and second openings at operation 808. The gate dielectric layer 450 may be formed by a chemical vapor deposition (CVD), physical vapor deposition (PVD), atomic layer deposition (ALD), spin-on coating, other proper operation, or combinations thereof. Since the depths of the plug portions 460a and 460b are different, the deposit operations may be separated in some embodiments. Plug portions 460a and 460b may be formed of any conductive material suitable for a particular application. Materials that may be suitable include, for example, polysilicon, doped polysilicon, aluminum, copper, or the like. Once the plug portions 460a and 460b are filled to the same level as the first surface 420a of the semiconductor substrate 420, the deposition operation continues to complete the structures of gate structures 460L and 460R. It is understood that the plug portions 460a and 460b have a smaller or equal width compared to the other portions of the gate structures 460L and 460R.

Next, at operation 812, temporary carrier depositories 470 are formed in proximity to the first surface 420a of the semiconductor substrate 420. Additionally, temporary carrier depositories 470 may be used to connect to a processing unit for outputting electrical signals. Once the temporary carrier depositories 470 are formed, the process continues to operation 814, which is optional, where backside trench isolations (BTIs) 490 positioned between the neighboring pixels are formed. Typically, a BTI 490 is a trench extending into a predetermined depth of the semiconductor substrate 420 and filled with oxide or other dielectric materials. In the present embodiment, the present of the BTIs 490 may depend on the crosstalk influences.

Next, a bottom-anti-reflective coating (BARC) 4100 is formed at the second surface 420b of the semiconductor substrate 420 at operation 816. In the depicted embodiment, the BARC 4100 directly contact the second surface 420b of the semiconductor substrate 420. A composition, an index of refraction, and an extinction coefficient of the BARCs 4100 can be tuned so that the BSI image sensor device exhibits optimal quantum efficiency. Then, at operation 818A, a first color filter layer 4200a and a second color filter layer 4200b is formed over the BARC 4100 to adjust the performance of the BSI image sensor. For simplicity, the cross sectional views for some steps shown in the flow diagram of FIG. 8 are omitted. Persons having ordinary skill in the art may understand the structures accomplished in each step by referring to FIG. 7H-7K.

Embodiments of the present disclosure provide a BSI image sensor device with an improved design about the gate structure of the BSI image sensor device to solve the problems faced by the conventional BSI image sensor structure. Particularly, the gate structure for controlling the charges generated in the photosensitive element, are designed with a plug portion. Additionally, the depth of the plug portions may be determined according to the wavelength of the incident radiation. The incident radiation may be visible light. Alternatively, the incident radiation could be IR, ultraviolet (UV), X-ray, microwave, other suitable radiation type, or combinations thereof. In some embodiment, the photosensitive element of the BSI image sensor device may be adjusted separately with distinct implantation operations depending on the wavelength of the incident radiation. Particularly, the positions and the sizes of the photosensitive elements as well as the depth of the plug portion of the gate structure are adjustable features according to intended purposes. With the BSI image sensor described herein, the transfer efficiency of the charges in the BSI image sensor device can be optimized according to different wavelengths of the incident radiation.

Some embodiments of the present disclosure provide an image sensor including a pixel array. The pixel array includes a plurality of pixels, and each of the plurality of pixels includes a semiconductor substrate having a first surface and a second surface, a photosensitive element, a gate structure, and a temporary carrier depository. The second surface is opposite to the first surface. The photosensitive element is positioned in the semiconductor substrate. The gate structure is disposed over the first surface of the semiconductor substrate. The temporary carrier depository is in proximity to the first surface of the semiconductor substrate. The gate structure has a plug portion extending from the first surface toward the second surface.

Some embodiments of the present disclosure provide an image sensor including a pixel array. The pixel array includes a semiconductor substrate having a first surface and a second surface, a first and a second photosensitive element, a first and a second gate structure. The second surface is opposite to the first surface. The first photosensitive element is positioned in a first region of the semiconductor substrate. The second photosensitive element is positioned in a second region of the semiconductor substrate. The first gate structure and the second gate structure are disposed over the first surface of the semiconductor substrate. The first gate structure has a first plug portion extending from the first surface toward the second surface, and the second gate structure has a second plug portion extending from the first surface toward the second surface. A first depth of the first plug portion is shorter than a second depth of the second plug portion.

Some embodiments of the present disclosure provide a method for manufacturing an image sensor, including (1) forming a first photosensitive element in a first region of a semiconductor substrate, and the semiconductor substrate having a first surface and a second surface opposite to the first surface, (2) forming an opening in the semiconductor substrate by a dry etching operation, and (3) forming a first gate structure with a plug portion in the opening. The plug portion extends from the first surface toward the second surface.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and operations described in the specification. As one of ordinary skill in the art will readily appreciate from the present disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. An image sensor including a pixel array, wherein the pixel array comprises a plurality of pixels, and wherein each of the plurality of pixels includes:
    a semiconductor substrate having a first surface and a second surface opposite to the first surface;
    a photosensitive element in the semiconductor substrate;
    a gate structure partially over the first surface of the semiconductor substrate; and
    a temporary carrier depository in proximity to the first surface of the semiconductor substrate,
    wherein the gate structure comprises a plug portion extending from the first surface toward the second surface, a section of the plug portion being laterally coupled to the photosensitive element by means of having a semiconductor substrate separation between the section of the plug portion and the photosensitive element, and
    wherein the photosensitive element comprises a doping concentration profile having a doping concentration at a bottom of the photosensitive element greater than a doping concentration at a top of the photosensitive element.

2. The image sensor of claim 1, wherein a shallow trench isolation (STI) in proximity to the first surface of the semiconductor substrate is between each of the plurality of the pixels.

3. The image sensor of claim 1, wherein a backside trench isolation (BTI) in proximity to the second surface of the semiconductor substrate is between each of the plurality of the pixels.

4. The image sensor of claim 1, further comprising a bottom-anti-reflective coating (BARC) at the second surface.

5. The image sensor of claim 1, wherein the width of the plug portion of the gate structure is between about 100 nm and about 250 nm.

6. The image sensor of claim 1, wherein a width of the semiconductor substrate separation is lower than 10 nm.

7. An image sensor including a pixel array, comprising:
    a semiconductor substrate having a first surface and a second surface opposite to the first surface;
    a first photosensitive element in a first region of the semiconductor substrate;
    a second photosensitive element in a second region of the semiconductor substrate;
    a first gate structure over the first surface of the semiconductor substrate; and
    a second gate structure over the first surface of the semiconductor substrate,
    wherein the first gate structure has a first plug portion extending from the first surface toward the second surface and the second gate structure has a second plug portion extending from the first surface toward the second surface, and wherein a first depth of the first plug portion is shorter than a second depth of the second plug portion; and wherein the first photosensitive element comprises a doping concentration profile having a doping concentration at a bottom of the first photosensitive element greater than a doping concentration at a top of the first photosensitive element.

8. The image sensor of claim 7, further comprising:
a third photosensitive element in a third region of the semiconductor substrate; and
a third gate structure over the first surface of the semiconductor substrate,
wherein the third gate structure has a third plug portion extending from the first surface toward the second surface, and
wherein a third depth of the third plug portion is greater than the second depth of the second portion and the second depth of the second plug portion is greater than the first depth of the first plug portion.

9. The image sensor of claim 8, wherein a depth of the third plug portion is greater than half of a thickness of the semiconductor substrate.

10. The image sensor of claim 7, wherein a backside trench isolation (BTI) in proximity to the second surface of the semiconductor substrate is between the first region and the second region.

11. The image sensor of claim 7, wherein a width of the first plug portion is between about 100 nm and about 250 nm.

12. The image sensor of claim 7, wherein the first photosensitive element is configured to sense a wavelength longer than that being sensed by the second photosensitive element.

13. The image sensor of claim 12, wherein the first photosensitive element is configured to sense wavelength longer than red.

14. The image sensor of claim 7, further comprising a bottom-anti-reflective coating (BARC) at the second surface.

15. The image sensor of claim 7, wherein the first plug portion and the second plug portion comprise polysilicon.

16. A method for manufacturing an image sensor, comprising:
forming a first photosensitive element in a first region of a semiconductor substrate having a first surface and a second surface opposite to the first surface;
forming an opening in the semiconductor substrate by a dry etching operation, a section of the opening being laterally coupled to the first photosensitive element; and
forming a first gate structure with a plug portion in the opening,
wherein the plug portion extends from the first surface toward the second surface, and
wherein the first photosensitive element comprises a doping concentration profile having a doping concentration at a bottom of the first photosensitive element greater than a doping concentration at a top of the first photosensitive element.

17. The method of claim 16, further comprising:
forming a second photosensitive element in a second region of the semiconductor substrate; and
forming a second gate structure with a plug portion in the semiconductor substrate, wherein the plug portion extends from the first surface toward the second surface, and
wherein the plug portion of the second gate structure is shorter than the plug portion of the first gate structure.

18. The method of claim 17, further comprising:
forming a backside trench isolation (BTI) over the second surface of the semiconductor substrate between the first region and the second region.

19. The method of claim 16, further comprising:
forming a bottom-anti-reflective coating (BARC) over the second surface of the semiconductor substrate.

20. The method of claim 16, further comprising:
laterally coupling a section of the plug portion of the first gate structure to the first photosensitive element.

* * * * *